(12) United States Patent
Sun et al.

(10) Patent No.: US 10,840,419 B2
(45) Date of Patent: Nov. 17, 2020

(54) NITRIDE SEMICONDUCTOR LIGHT-EMITTING DEVICE AND MANUFACTURE METHOD THEREFORE

(71) Applicant: Suzhou Institute of Nano-Tech and Nano-Bionics (Sinano), Chinese Academy of Sciences, Suzhou (CN)

(72) Inventors: Qian Sun, Suzhou (CN); Meixin Feng, Suzhou (CN); Yu Zhou, Suzhou (CN); Hongwei Gao, Suzhou (CN); Hui Yang, Suzhou (CN)

(73) Assignee: Suzhou Institute of Nano-Tech and Nano-Bionics (Sinano), Chinese Academy of Sciences, Suzhou (CN)

( * ) Notice: Subject to any disclaimer, the term of this patent is extended or adjusted under 35 U.S.C. 154(b) by 13 days.

(21) Appl. No.: 16/477,128

(22) PCT Filed: Dec. 15, 2017

(86) PCT No.: PCT/CN2017/116518
§ 371 (c)(1),
(2) Date: Jul. 10, 2019

(87) PCT Pub. No.: WO2018/130046
PCT Pub. Date: Jul. 19, 2018

(65) Prior Publication Data
US 2019/0363228 A1  Nov. 28, 2019

(30) Foreign Application Priority Data
Jan. 12, 2017  (CN) .......................... 2017 1 0022586

(51) Int. Cl.
*H01L 33/58* (2010.01)
*H01L 33/00* (2010.01)
(Continued)

(52) U.S. Cl.
CPC ............ *H01L 33/58* (2013.01); *H01L 33/007* (2013.01); *H01L 33/0045* (2013.01);
(Continued)

(58) Field of Classification Search
None
See application file for complete search history.

(56) References Cited

U.S. PATENT DOCUMENTS

| 2006/0078024 A1* | 4/2006 | Matsumura | H01S 5/16 372/46.01 |
| 2011/0198668 A1* | 8/2011 | Murai | H01L 33/32 257/103 |

(Continued)

*Primary Examiner* — Michelle Mandala
*Assistant Examiner* — Jordan M Klein
(74) *Attorney, Agent, or Firm* — Wang Law Firm, Inc.

(57) ABSTRACT

The present application discloses a nitride semiconductor light-emitting device and a manufacture method thereof. The nitride semiconductor light-emitting device includes an epitaxial structure, wherein the epitaxial structure has a first face and a second face opposite to the first face, the first face is a (000$\bar{1}$) nitrogen face and located at the n type side of the epitaxial structure, the second face is located at the p type side of the epitaxial structure, the n type side of the epitaxial structure is electrically contacted with an n type electrode, the p type side is electrically contacted with a p type electrode, and a ridge waveguide structure is formed on the first face. The nitride semiconductor light-emitting device, especially a III-V nitride semiconductor laser or a super-radiance light-emitting diode, of the present application, has the advantages of low resistance, low internal loss, small threshold current, small thermal resistance and good stability and reliability and the like, and meanwhile the preparation process is simple and is easily implemented.

14 Claims, 7 Drawing Sheets

(51) Int. Cl.
*H01L 33/32* (2010.01)
*H01S 5/227* (2006.01)
*H01S 5/343* (2006.01)

(52) U.S. Cl.
CPC ............ *H01L 33/32* (2013.01); *H01S 5/2275* (2013.01); *H01S 5/34333* (2013.01)

(56) References Cited

U.S. PATENT DOCUMENTS

| | | | |
|---|---|---|---|
| 2013/0228742 A1* | 9/2013 | Tanaka | H01L 33/06 257/13 |
| 2014/0015105 A1* | 1/2014 | Toba | H01L 29/34 257/615 |
| 2018/0138663 A1* | 5/2018 | Lai | H01S 5/04253 |

* cited by examiner

NITRIDE SEMICONDUCTOR LIGHT-EMITTING DEVICE AND MANUFACTURE METHOD THEREFORE

TECHNICAL FIELD

The disclosure relates to a semiconductor light-emitting device and a manufacture method thereof, and particularly relates to a nitride semiconductor light-emitting device having a ridge waveguide structure, such as a III-V nitride semiconductor laser, a super-radiance light-emitting diode, and a manufacture method thereof, belonging to the field of semiconductor photoelectric techniques.

BACKGROUND

A III-V nitride semiconductor is called a third-generation semiconductor material, and has the advantages of large band gap width, good chemical stability, strong radiation resistance and the like. The band gap width of the III-V nitride semiconductor ranges from deep ultraviolet light, entire visible light to near-infrared light, and can be used for manufacturing semiconductor light-emitting devices, such as a light-emitting diode, a laser and a super-radiance light-emitting diode. Where, the laser and the super-radiance light-emitting diode based on the III-V nitride semiconductor have the advantages of simple manufacturing, small size, light weight, long service life and high efficiency, and will be expected to be widely applied to the fields of laser display, laser illustration, laser storage and the like.

A nitride semiconductor photoelectric device is typically of a p-n junction structure. For the III-V nitride semiconductor, dicyclopentadienyl magnesium ($CP_2Mg$) is typically used as an n type doping agent. Since a Mg acceptor has relatively high ionization energy (GaN: 170 meV, AlN: 470 meV) in a nitride, less than 10% of the Mg acceptor is usually ionized, so that the concentration of holes in the p-type nitride semiconductor is relatively low. Meanwhile, since the doping concentration of the Mg acceptor in the p type nitride semiconductor is relatively high, the effective mass of holes is relatively large and the migration rate of holes is relatively low, the resistance of the p type nitride semiconductor is relatively large. Furthermore, in order to allow the III-V nitride semiconductor laser, the super-radiance light-emitting diode and the like to have relatively good optical field limitation, the thickness of the p type nitride semiconductor typically needs to be controlled to 500 nm or more, which makes the series resistance of the devices large and lead to a fact that about 30% or more of voltage drop is on the series resistance of the devices when the laser operates. Thermal power when the laser operates is relatively high, and the junction temperature is greatly raised, thereby seriously influencing the performance and service life of the laser. In an ultraviolet laser, the Al component in the p type AlGaN optical limitation layer is higher, the ionization energy of the Mg acceptor is larger, the concentration of the holes in the p type AlGaN optical limitation layer is lower, the series resistance of the laser is larger, thermal power is larger, and junction temperature is higher; meanwhile, low hole concentration causes asymmetrical injection of electron holes, which influences the injection efficiency of the laser. All of the above factors influence threshold current density, service life and the like of the ultraviolet laser.

In addition, the nitride semiconductor laser or super-radiance light-emitting diode typically adopts AlGaN as the optical limitation layer. In the traditional laser or the super-radiance light-emitting diode, the refractive index difference between the AlGaN optical limiting layer and a waveguide layer is relatively small (about 5%), leading to relatively small optical limitation factor (about 2.5%) of the laser or super-radiance light-emitting diode, far smaller than that (about 8%) of the traditional III-V GaAs or InP-based semiconductor laser or super-radiance light-emitting diode. Thus, the light-emitting material required for lasing of the nitride semiconductor laser or super-radiance light-emitting diode is higher in gain and larger in threshold current.

Because of influence from the large resistance of the p type layer in the laser or super-radiance light-emitting diode, the small limitation factor of the quantum well of the laser and other factors, the electro-optic conversion efficiency of the nitride semiconductor laser or super-radiance light-emitting diode is still less than 40% currently, and the rest electrical power is converted into thermal power. However, the traditional laser or super-radiance light-emitting diode is packaged in a front-mounted manner, heat needs to pass through the laser or super-radiance light-emitting diode structure having a thickness of about 3 μm and the substrate having a thickness of about 100 μm to be conducted to heat sink, the conduction path of heat in the laser or super-radiance light-emitting diode is extremely long, and since the thermal conductivity of the substrate is relatively low, the thermal resistance of the laser or super-radiance light-emitting diode is extremely large. However, the thermal power of the laser or super-radiance light-emitting diode is relatively large, and therefore the junction temperature of the device is relatively high, seriously influencing the performance and service life of the device.

In addition, relative to a GaAs or InP-based material, a (0001) Ga face III-V nitride semiconductor material has the characteristics of good chemical stability, acid/alkali resistance, difficult corrosion and the like. For a III-V nitride ridge laser or super-radiance light-emitting diode, the ridge needs to be formed through dry etching, then the device is packaged by adopting a reversed or front-mounted manner, for example, see CN103701037A, CN103001119A and other documents.

Such the processes have the following defects that: 1, current is injected through the p type layer in the ridge of the device, the area of the injection region is relatively small, the resistance of the device is relatively large, and the p type layer is relatively thick, the series resistance of the device is large, the junction temperature is easily caused to be raised, the performance and service life of the device are influenced; 2, the reflexive index difference of different materials in the nitride semiconductor is relatively small, the optical field limitation of the device is relatively weak, the gain of the required threshold material is relatively large, and the threshold current is relatively high; 3, if front-mounted packaging is used, a distance between a heat source inside the device and heat sink is relatively far, and the thermal conductivity of the substrate is relatively low, leading to large heat resistance of the device. For reverse-packaged devices, although the distance between the heat source and the heat sink is small, the thermal conductivity of insulation medium films such as $SiO_2$ in other regions of the protection device except the ridge region is extremely low, and heat can only pass through the ridge to be conducted to the heat sink, which results in small heat radiating area and large resistance of the device; and the light-emitting cavity face is near a soldering flux when reverse packaging is performed, thus the light-emitting cavity face is easily polluted, and short circuit and electric leakage is generated so as to cause the degeneration of the performance of the device; 4, dry etching not only can result in a rough side wall but also cause light scattering, etc. The dry etching also bring surface states, damages and defects, these surface states, damages and defects can become not only non-radiation composite centers to influence the effectiveness of the laser or super-radiance light-emitting diode, but also electric leakage passages to influence the reliability and stability of the device.

SUMMARY

The main object of the disclosure is to provide a nitride semiconductor light-emitting device and a manufacture method thereof, overcoming the shortages of the prior art.

In order to achieve the above object of the disclosure, the present application adopts the following technical solution:

An embodiment of the present application provides a nitride semiconductor light-emitting device, comprising an epitaxial structure, wherein, the epitaxial structure has a first face and a second face opposite to the first face, the first face is a (000$\bar{1}$) nitrogen face and is located at the n type side of the epitaxial structure, the second face is located at the p type side of the epitaxial structure, the n type side of the epitaxial structure is electrically contacted with an n type electrode, the p type side is electrically contacted with a p type electrode, and a ridge waveguide structure is formed on the first face.

Further, the epitaxial structure comprises an n type contact layer, an n side waveguide layer, an active area, a p side waveguide layer and a p type contact layer which are arranged in turn, the n type electrode is electrically contacted with the n type contact layer, and the p type electrode is electrically contacted with the p type contact layer.

In some preferred embodiments, the p type electrode is contacted with the entire face of the p type contact layer.

Furthermore, ohmic contact is formed between the n type electrode and the n type contact layer, and ohmic contact is formed between the p type electrode and the p type contact layer.

In some preferred embodiments, the p type electrode is also connected with a support sheet.

Furthermore, the p type electrode is connected with the support sheet through a bonding layer. Preferably, the bonding layer comprises a metal bonding layer or a non-metal bonding layer.

In some preferred embodiments, an optical field limitation layer is provided between the p type electrode and the support sheet.

Furthermore, the optical field limitation layer is provided between the p type electrode and the bonding layer.

Preferably, the optical field limitation layer comprises at least one low-refractive-index material.

An embodiment of the present application also provides a manufacture method of a nitride semiconductor light-emitting device, comprising:

growing and forming an epitaxial structure of a nitride semiconductor light-emitting device on a substrate, wherein, the epitaxial structure has a first face combined with the substrate and a second face opposite to the first face, the first surface is a (000$\bar{1}$) nitrogen face and is located at the n type side of the epitaxial structure, and the second face is located at the p type side of the epitaxial structure;

providing a p type electrode on the second face of the epitaxial structure, and allowing the p type electrode and the p type side of the epitaxial structure to form ohmic contact;

removing the substrate, then providing an n type electrode on the first face of the epitaxial structure, and allowing the n type electrode and the n type side of the epitaxial structure to form ohmic contact; and etching or corroding the first face of the epitaxial structure to form a ridge waveguide structure.

Further, the manufacture method comprises: providing an etching mask on the first face of the epitaxial structure, then etching or corroding the first face of the epitaxial structure by using a dry etching or wet etching process to form the ridge waveguide structure.

In some preferred embodiments, the manufacture method comprises: corroding the first surface of the epitaxial structure by using the wet etching process to form the ridge waveguide structure.

In some preferred embodiments, the manufacture method also comprises: bonding the p type electrode to the support sheet by utilizing a bonding material.

Furthermore, the bonding material comprises a metal bonding material or a non-metal bonding material.

In some preferred embodiments, the manufacture method also comprises: forming an optical field limitation layer on the p type electrode, and then bonding the optical field limitation layer to the support sheet by utilizing a bonding material.

Preferably, the optical field limitation layer comprises at least one low-refractive-index material.

In some embodiments, the manufacture method comprises: sequentially growing an n type contact layer, an n type optical limitation layer, an n side waveguide layer, an active area, a p side waveguide layer, an electron barrier layer and a p type contact layer on a substrate to form the epitaxial structure.

In some embodiments, the manufacture method also comprises: depositing a conducting material as the p type electrode on the p type contact layer and performing ohmic contact annealing so that the p type electrode and the p type contact layer form ohmic contact. Preferably, the p type electrode is contacted with the entire face of the p type contact layer.

In some preferred embodiments, the manufacture method also comprises: after the manufacture of the n type electrode is completed, providing an etching mask on the first face of the epitaxial structure by using a photoetching process, and then corroding the first face of the epitaxial structure by using a wet etching process to form the ridge waveguide structure.

In some embodiments, the manufacture method also comprises: after the n type electrode is exposed out of an insulation film, etching or corroding the epitaxial structure by using a dry etching or wet etching process, forming a mesa structure at one side of the ridge waveguide structure, and distributing the p type electrodes at the bottom of the mesa structure, and then manufacturing the thickening electrodes on the p type electrode and the n type electrode.

In some embodiments, the manufacture method also comprises: after the manufacture of the thickening electrode is completed, preparing a cavity surface of a nitride semiconductor light-emitting device by using any one or a combination of two or more of cleavage, dry etching and wet etching.

Further, the above nitride semiconductor device comprises a nitride semiconductor laser or a super-radiance light-emitting diode, and is not limited thereto.

Preferably, the nitride semiconductor laser comprises a III-V nitride semiconductor laser or a super-radiance light-emitting diode.

Compared with the prior art, the nitride semiconductor laser, especially the III-V nitride semiconductor laser or super-radiance light-emitting diode, of the present application has the advantages of low resistance, low internal loss, small threshold current, small thermal resistance and good stability and reliability and the like, can greatly promote the performance and service life of the device, especially, effectively promotes the performance and service life of the device of a AlGaN material containing a thick and high Al component, such as ultraviolet laser or super-radiance light-emitting diode. Meanwhile, the preparation process of the nitride semiconductor light-emitting device of the present application is simple and is easily implemented.

BRIEF DESCRIPTION OF THE DRAWINGS

For more clearly describing the technical solution in the embodiments of the disclosure or the prior art, drawings used in the embodiments or the prior art will be simply described below, apparently, the drawings in the following description are only some embodiments in the present application. For those of ordinary skill in the art, other drawings can also be obtained according to these drawings without creative efforts.

Figure 1:
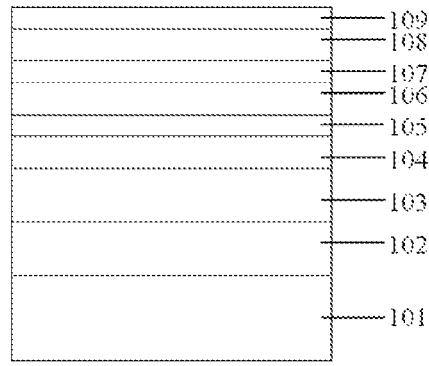
FIG. 1 is a schematic diagram of an epitaxial structure of a nitride semiconductor laser or super-radiance light-emitting diode (abbreviated as "device" hereinafter) according to a typical embodiment of the present application.

Reference numbers: 101-substrate, 102-n type contact layer, 103-n type optical limitation layer, 104-n side waveguide layer, 105-active region, 106-p side waveguide layer, 107-electron barrier layer, 108-p type optical limitation layer, 109-p type contact layer, 110-p type ohmic contact electrode, 111-bonding material, 112-support sheet, 113-n type ohmic contact electrode, 114-photoresist, 115-insulation medium film, 116-thickening electrode, 117-electrode on the support sheet, 201-substrate, 202-n type contact layer, 203-n type optical limitation layer, 204-n side waveguide layer, 205-active area, 206-p side waveguide layer, 207-electron barrier layer, 208-p type contact layer, 209-p type ohmic contact electrode, 210-low-refractive-index material 1, 211-low-refractive-index material 2, 212-bonding material, 213-support sheet, 215-n type ohmic contact electrode, 216-photoresist, 217-insulation medium film, 218-thickening electrode.

DESCRIPTION OF THE EMBODIMENTS

One aspect of the embodiment of the present application provides a nitride semiconductor light-emitting device, comprising an epitaxial structure, wherein, the epitaxial structure has a first face and a second face opposite to the first face, the first face is a (000$\bar{1}$) nitrogen surface and is located at the n type side of the epitaxial structure, the second face is located at the p type side of the epitaxial structure, the n type side of the epitaxial structure is electrically contacted with an n type electrode, the p type side is electrically contacted with a p type electrode, and a ridge waveguide structure is formed on the first surface.

Further, the epitaxial structure comprises an n type contact layer, an n side waveguide layer, an active area, an p side waveguide layer and a p type contact layer which are arranged in turn, the n type electrode is electrically contacted with the n type contact layer, and the p type electrode is electrically contacted with the p type contact layer.

Preferably, the p type electrode is contacted with the entire face of the p type contact layer.

Further, an n type optical limitation layer is also provided between the n type contact layer and the n side waveguide layer.

Furthermore, ohmic contact is formed between the n type electrode and the n type contact layer, and ohmic contact is formed between the p type electrode and the p type contact layer.

Preferably, the p type electrode is contacted with the entire face of the p type contact layer.

Further, an n type optical limitation layer is also provided between the n type contact layer and the n side waveguide layer.

Further, a p type optical limitation layer is also provided between the p type side waveguide layer and the p type contact layer.

Further, an electron barrier layer is also provided between the p side waveguide layer and the p type contact layer. Preferably, the electrode barrier layer is provided between the p side waveguide layer and the p type optical limitation layer.

Further, the n type contact layer is thinned, and its thickness is preferably 5~3000 nm.

Further, an insulation film is covered on at least partial region of the first face of the epitaxial structure except the ridge waveguide structure.

Furthermore, the material of the insulation film comprises any one or a combination of two or more of $SiO_2$, SiN$_x$ (x=0~1), SiON, Al$_2$O$_3$, AlON, SiAlON, TiO$_2$, Ta$_2$O$_5$, ZrO$_2$ and polycrystalline silicon, but is not limited thereto.

Further, the first face of the epitaxial structure is also covered with a thickening electrode which is electrically connected with the n type electrode.

Further, the ridge waveguide structure is preferably 0.5~100 μm in ridge wideness and 0~2 μm, especially preferably larger than 0 and less than or equal to 2 μm, in ridge depth.

In some embodiments, the materials of the n type contact layer, the p type contact layer, the n type optical limitation layer, the n type optical limitation layer, the p side waveguide layer and the n side waveguide layer can be selected from III-V nitrides, for example, can comprise Al$_{x1}$In$_{y1}$Ga$_{(1-x1-y1)}$N, wherein, both of x1 and y1 are larger than or equal to 0 and less than or equal to 1, and 0≤(x1+y1)≤1.

In some embodiments, the material of the active area can be selected from III-V nitrides, for example can comprise Al$_{x2}$In$_{y2}$Ga$_{(1-x2-y2)}$N or Al$_{x3}$In$_{y3}$Ga$_{(1-x3-y3)}$N, wherein, x2, y2, x3 and y3 are all larger than or equal to 0 and less than or equal to 1, 0≤(x2+y2)≤1, and 0≤(x3+y3)≤1.

In some embodiments, the materials of the n type electrode and the p type electrode comprise any one or a combination of two or more of Ni, Ti, Pd, Pt, Au, Al, TiN, ITO and IGZO, and are not limited thereto.

Further, the p type electrode is also connected with a support sheet.

Furthermore, the support sheet comprises any one of a silicon substrate, a copper support sheet, a molybdenum-copper support sheet, a molybdenum support sheet and a ceramic plate, and is not limited thereto.

Preferably, the p type electrode is connected with the support sheet through a bonding layer. The bonding layer comprises a metal bonding layer or a non-metal bonding layer. For example, the metal bonding layer comprises any one or a combination of two or more of AuSn, NiSn, AuAu and NiGe, and is not limited thereto. For example, the non-metal bonding layer comprises any one or a combination of two or more of NaCl, SiO$_2$, CrO$_2$, Al$_2$O$_3$ and diamond.

In some preferred embodiments, an optical field limitation layer is also provided between the p type electrode and the support sheet.

Furthermore, the optical field limitation layer is provided between the p type electrode and the bonding layer.

Preferably, the optical field limitation layer comprises at least one low-refractive-index material. Where, the material of the optical field limitation layer comprises any one or a combination of two or more of SiO$_2$, SiN$_x$, TiO$_2$, ZrO$_2$, AlN, Al$_2$O$_3$, Ta$_2$O$_5$, HfO$_2$, HfSiO$_4$, AlON, porous GaN, TiN, ITO and IGZO, and is not limited thereto.

Further, the nitride semiconductor light-emitting device comprises a nitride semiconductor laser or a super-radiance light-emitting diode. Preferably, the nitride semiconductor light-emitting device comprises a III-V nitride semiconductor laser or a super-radiance light-emitting diode.

According to another aspect of the embodiment of the present application, provided is a manufacturing method of a nitride semiconductor light-emitting device, comprising:

growing and forming an epitaxial structure of a nitride semiconductor light-emitting device on a substrate, wherein, the epitaxial structure has a first face combined with the substrate and a second face opposite to the first face, the first face is a (000$\bar{1}$) nitrogen face and is located at the n type side of the epitaxial structure, and the second face is located at the p type side of the epitaxial structure;

providing a p type electrode on the second face of the epitaxial structure, and allowing the p type electrode and the p type side of the epitaxial structure to form ohmic contact;

removing the substrate, then providing an n type electrode on the first face of the epitaxial structure, and allowing the n type electrode and the n type side of the epitaxial structure to form ohmic contact; and etching or corroding the first face of the epitaxial structure to form a ridge waveguide structure.

Further, the manufacturing method comprises: providing an etching mask on the first face of the epitaxial structure, then etching or corroding the first face of the epitaxial structure by using a dry etching or wet etching process to form the ridge waveguide structure.

In some preferred embodiments, the manufacture method comprises: corroding the first face of the epitaxial structure by using the wet etching process to form the ridge waveguide structure.

Further, the manufacturing method comprises: manufacturing and forming the etching mask on the first face of the epitaxial structure by using a photoetching process.

Further, the ridge waveguide structure is preferably 0.5~100 μm in ridge wideness and preferably 0~2 μm, especially preferably larger than 0 and less than 2 μm, in ridge depth.

In some preferred embodiments, the manufacture method also comprises: bonding a p type electrode to a support sheet by utilizing a bonding material.

Further, the material of the support sheet can be described as above.

Further, the bonding material comprises a metal bonding material or a non-metal bonding material which can be described as above.

In some preferred embodiments, the manufacturing method also comprises: forming an optical field limitation layer on the p type electrode, and then bonding the optical field limitation layer to the support sheet by utilizing a bonding material.

Preferably, the optical field limitation layer comprises at least one low-refractive-index material. Further, the material of the optical field limitation layer can also be described as above.

In some embodiments, the manufacturing method comprises: sequentially growing an n type contact layer, an n type optical limitation layer, an n side waveguide layer, an active area, a p side waveguide layer, an electron barrier layer and a p type contact layer on a substrate to form the epitaxial structure.

In some embodiments, the manufacturing method also comprises: sequentially forming a p type optical limitation layer and a p type contact layer on the electron barrier layer.

In some embodiments, the manufacturing method also comprises: depositing a conducting material as a p type electrode on the p type contact layer and performing ohmic contact annealing, so that the p type electrode and the p type contact layer form ohmic contact. Preferably, the p type electrode contacts with the whole surface of the p type contact layer.

In some preferred embodiments, the manufacturing method also comprises: after the substrate is removed, performing thinning treatment on the n type contact layer, then depositing a conducting material as an n type electrode on the n type contact layer and performing ohmic contact annealing, so that the n type electrode and the n type contact layer form ohmic contact. Preferably, the thickness of the n type contact layer is 5~3000 nm.

In some preferred embodiments, the manufacturing method also comprises: after the manufacture of the n type electrode is completed, providing an etching mask on the first face of the epitaxial structure by using a photoetching process, and then corroding the first face of the epitaxial structure by using a wet etching process to form a ridge waveguide structure.

Further, the manufacturing method also comprises: after the ridge waveguide structure is formed, covering an insulation film on at least partial region of the first face of the epitaxial structure except the ridge waveguide structure, and exposing the n type electrode out of the insulation film.

Where, the material of the insulation film is similarly described as above.

Further, the manufacturing method also comprises: forming a thickening electrode on the n type electrode.

In some embodiments, the manufacturing method also comprises: after the n type electrode is exposed out of the insulation film, etching or corroding the epitaxial structure by using a dry etching or wet etching process, forming a mesa structure at one side of the ridge waveguide structure, and distributing the p type electrodes at the bottom of the mesa structure, and then manufacturing the thickening electrodes on the p type electrode and the n type electrode.

In some embodiments, the manufacturing method also comprises: after the manufacture of the thickening electrode is completed, preparing a cavity surface of a nitride semiconductor light-emitting device by using any one or a combination of two or more of cleavage, dry etching and wet etching.

Further, the material of the substrate comprises any one or a combination of two or more of GaN, AlN, sapphire, SiC and Si, and is not limited thereto.

Further, the materials of the n type contact layer, the p type contact layer, the n type optical limitation layer, the p side waveguide layer, the n side waveguide layer, the active region, the n type electrode and the p type electrode are similarly described as above.

Further, an etch reagent adopted by the wet etch process comprises an acid solution or alkaline solution. For example, the alkaline solution comprises any one or a combination of two or more of potassium hydroxide (KOH), sodium hydroxide (NaOH), tetramethyl ammonium hydroxide (TMAH); for example, the acid solution comprises any one or a combination of two of phosphoric acid ($H_3PO_4$) and hydrofluoric acid (HF); they are both not limited thereto.

Figure 2:
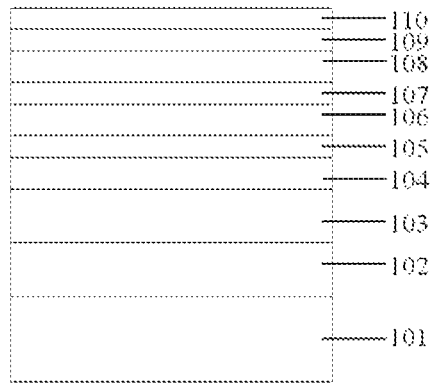
FIG. 2 is a structural diagram of a device after p type ohmic contact is formed according to a typical embodiment of the present application.
Figure 3:
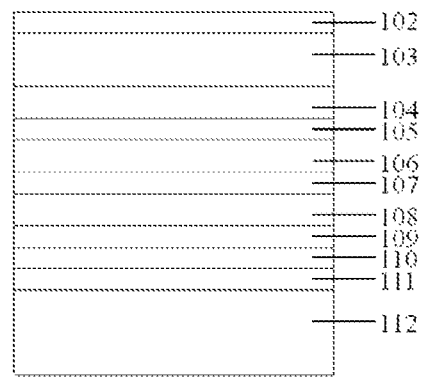
FIG. 3 is a structural diagram of a device after a substrate is removed according to a typical embodiment of the present application.
Figure 4:
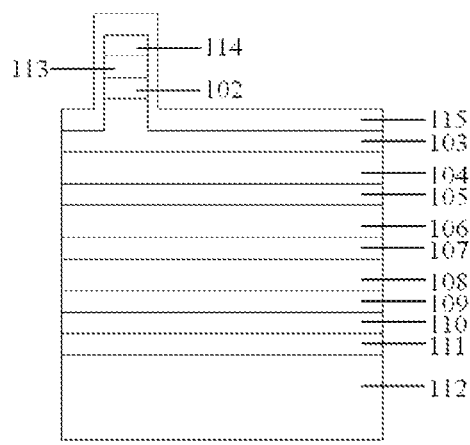
FIG. 4 is a structural diagram of a device after an insulation medium film is deposited according to a typical embodiment of the present application.
Figure 5:
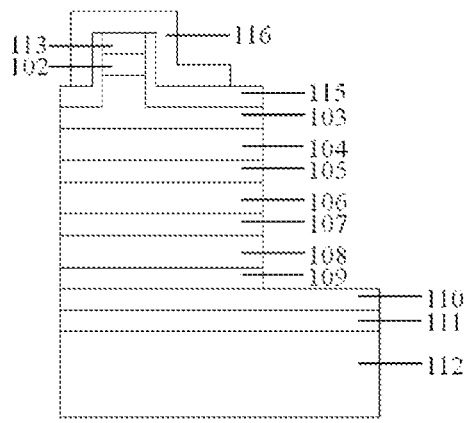
FIG. 5 is a structural diagram of a device after a thickening electrode is manufactured according to a typical embodiment of the present application.
Figure 6:
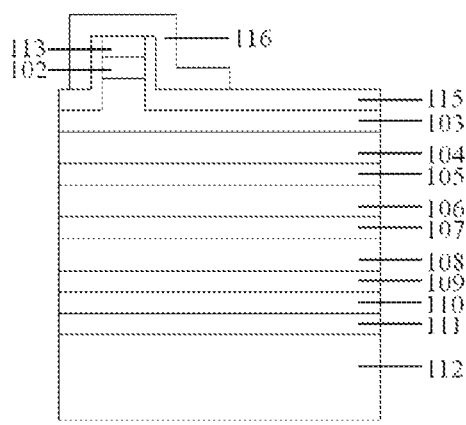
FIG. 6 is a structural diagram of a device after a planar electrode structure is manufactured according to a typical embodiment of the present application.
Figure 7:
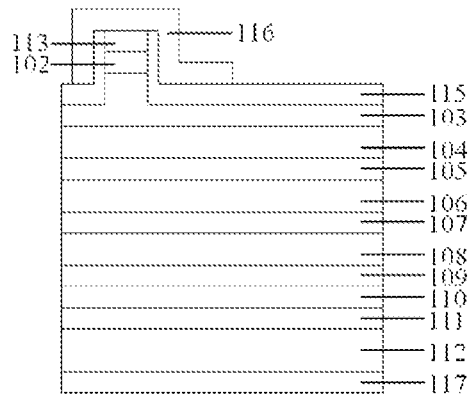
FIG. 7 is a structural diagram of a device having a vertical structure according to a typical embodiment of the present application.

Referring to FIG. 1-FIG. 8, in a typical embodiment of the present application, a preparation process of a nitride semiconductor laser or super-radiance light-emitting diode (abbreviated as "device" hereinafter) comprises:

growing an epitaxial structure on a substrate, namely, the epitaxial structure of the device, which comprises an n type contact layer, an n type optical limitation layer, an n side waveguide layer, an active region, a p side waveguide layer, an electron barrier layer, a p type optical limitation layer and a p type contact layer, as shown in FIG. 1;

washing the above epitaxial wafer, depositing a p type ohmic contact layer on the entire face of the p type contact layer and performing ohmic contact annealing to form relatively good ohmic contact, as shown in FIG. 2;

reversely bonding the epitaxial wafer to the support sheet, and allowing the p face ohmic contact electrode (namely, p type electrode) of the device to be downward to be bonded to the material on the support sheet, as shown in FIG. 3;

removing the substrate and partial n type contact layer by using methods such as thinning, grinding, laser stripping, dry etching or wet etching so that a thinner n type contact layer is remained to manufacture an n type ohmic contact electrode, as shown in FIG. 3;

depositing n type ohmic contact metal (namely, n type electrode) on ($000\bar{1}$) nitrogen face n type ohmic contact layer (namely, the above n type contact layer) to form ohmic contact;

spin-coating photoresist on the ($000\bar{1}$) nitrogen face n type ohmic contact electrode (namely, the above n type electrode) for photoetching, and subsequently, manufacturing the ridge (namely, ridge waveguide structure) of the device by using a dry etching or wet etching technique;

depositing the insulation medium film to protect the other regions of the device except the ridge and prevent current from being injected from these regions, as shown in FIG. 4;

stripping the insulation medium film and the photoresist on the ridge to expose out the n type ohmic contact electrode;

forming a thickening electrode on the n type ohmic contact electrode (namely, the foregoing n type electrode) through photoetching, metal deposition and stripping processes, as shown in FIG. 5;

forming a mesa at one side of the ridge through photoetching and wet etching or dry etching, wherein, the bottom of the mesa is the p type ohmic contact electrode (namely, the above p type electrode), as shown in FIG. 6; or thinning a support sheet, depositing metal on the other face of the support sheet to form electric contact, as shown in FIG. 7;

and manufacturing a cavity surface of a laser or super-radiance light-emitting diode, wherein, the manufacturing method comprises any one or a combination of two or more of cleavage, dry etching and wet etching, and is not limited thereto, and then coating and splitting to form a tube core of a device.

Figure 8:
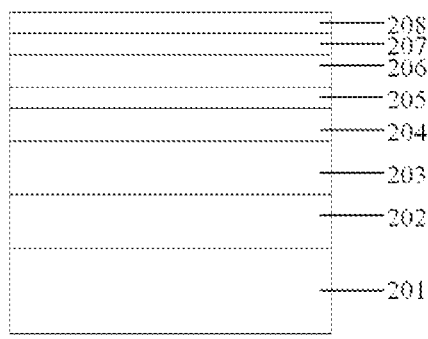
FIG. 8 is a schematic diagram of an epitaxial structure of a nitride semiconductor laser or super-radiance light-emitting diode (abbreviated as "device" hereinafter) according to another typical embodiment of the present application.
Figure 9:
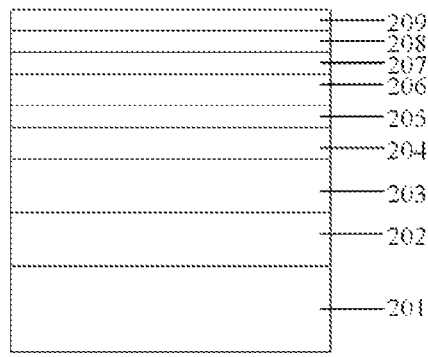
FIG. 9 is a structural diagram of a device after p type ohmic contact is formed according to another typical embodiment of the present application.
Figure 10:
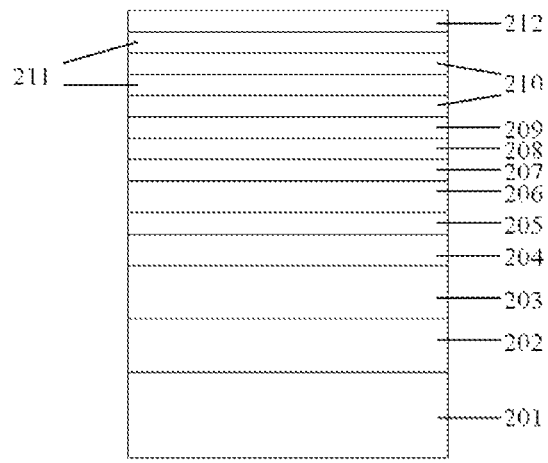
FIG. 10 is a structural diagram of a device after an optical field limitation layer and a bonding material are deposited according to another typical embodiment of the present application.
Figure 11:
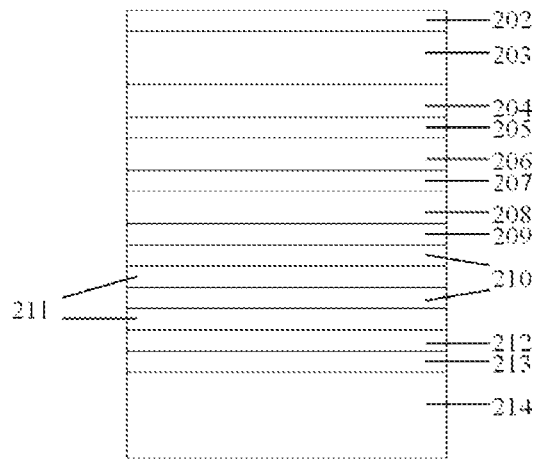
FIG. 11 is a structural diagram of a device after a substrate is removed according to another typical embodiment of the present application.
Figure 12:
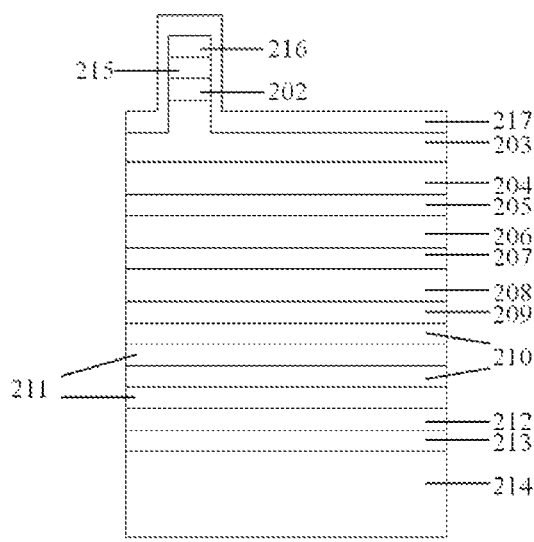
FIG. 12 is a structural diagram of a device after an insulation medium film is deposited according to another typical embodiment of the present application.
Figure 13:
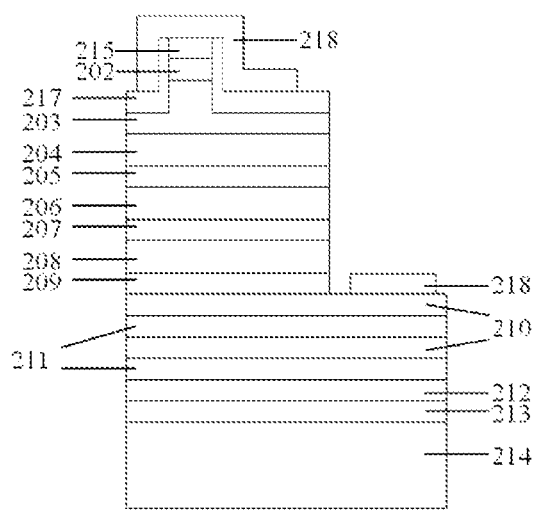
FIG. 13 is a structural diagram of a device having a mesa structure according to another typical embodiment of the present application.

Also referring to FIG. 9-FIG. 13, in another typical embodiment of the present application, a preparation process of a nitride semiconductor laser or a super-radiance light-emitting diode (abbreviated as "device" hereinafter) comprises:

growing an epitaxial material on a substrate, namely, the epitaxial structure of the device, which comprises an n type contact layer, an n type optical limitation layer, an n side waveguide layer, an active region, a p side waveguide layer, an electron barrier layer and a p type contact layer; or comprises n type contact layer, an n type optical limitation layer, an n side waveguide layer, an active region, a p side waveguide layer, an electron barrier layer, a p type optical limitation layer and a p type contact layer, as shown in FIG. 8;

washing the epitaxial wafer, depositing a transparent conducting film (namely, p type electrode) on the entire face of the p type contact layer and performing ohmic contact annealing to form relatively good ohmic contact, as shown in FIG. 9;

periodically and alternatively depositing a low-refractive-index material 1 and a low-refractive-index material 2 on the transparent conducting film, and subsequently depositing a bonding material, as shown in FIG. 10;

reversely bonding the epitaxial wafer to the support sheet, and allowing the bonding face of the device to be downward to be bonded to the material on the support sheet;

removing the substrate and partial n type contact layer by using methods such as thinning, grinding, laser stripping, dry etching or wet etching so that a thinner n type contact layer is remained to manufacture an n type ohmic contact electrode (namely, n type electrode), as shown in FIG. 11;

depositing n type ohmic contact metal (namely, n type contact electrode) on the (000$\bar{1}$) nitrogen face n type ohmic contact layer (namely, the above n type contact layer) to form ohmic contact;

spin-coating photoresist on the (000$\bar{1}$) nitrogen face n type ohmic contact electrode (namely, the n type electrode) for photoetching, and subsequently, manufacturing the ridge (namely, ridge waveguide structure) of the device by using a dry etching or wet etching technique;

depositing the insulation medium film to protect the other regions of the device except the ridge and prevent current from being injected from these regions, as shown in FIG. 12;

stripping the insulation medium film and the photoresist on the ridge to expose out the n type ohmic contact electrode;

forming a mesa at one side of the ridge through photoetching and wet etching or dry etching, wherein, the bottom of the mesa is the p type ohmic contact electrode;

manufacturing thickening electrodes on the p type ohmic contact electrode and the n type ohmic contact electrode through photoetching, metal deposition and stripping processes, as shown in FIG. 13;

and manufacturing a cavity surface of a laser or super-radiance light-emitting diode, wherein, the manufacturing method comprises any one or a combination of two or more of cleavage, dry etching and wet etching, and is not limited thereto, and then coating and spitting to form a tube core of a device.

In terms of the above technical solution, the present application has the following advantages:

1. By manufacturing the ridge waveguide structure on the (000$\bar{1}$) nitrogen face of nitride semiconductor light-emitting device and adopting an entire face contact manner for the (0001) Ga face p type ohmic contact, the area of p face current injection region can be greatly enlarged, and the resistance of the device is reduced. And then, the optical field is limited from the p side through selection of the low-refractive-index material so that the p type optical field limitation layer in the device can be thinned, and even omitted, and the series resistance of the device is smaller. In such a way, the resistance of the device of the present application is extremely small, and then the electro-optic efficiency of the device can be effectively promoted, the thermal power is reduced, the junction temperature of the device is reduced, and the performance and reliability of the device are promoted.

2. Further, the device of the present application can adopt the low-refractive-index material to limit the optical field, and the thickness and refractive index of the low-refractive-index material are adjustable, the refractive index difference of the optical field limitation layer and the nitride material can be increased, the optical field limitation in the laser is enhanced, the device of the present application has a high optical limitation factor, the gain of the threshold material of the laser or super-radiance light-emitting diode can be greatly reduced so that the threshold current of the device is reduced. Since the limitation factors of the device are increased, the part of light distributed in the active area and the waveguide layer of a low-loss quantum well is increased to result in reduced internal loss of the laser, and thus the threshold current of the laser is greatly reduced.

3. Further, the distance between the heat source and heat sink of the device of the present application is small, and heat conduction path is short; meanwhile, the heat conductivity of the heat sink is high, heat generated by the heat source can pass through the entire p face to be conducted to the heat sink, and there is no influence from low-heat-conductance medium films such as $SiO_2$, problems such as short circuit and cavity face pollution are not easily generated, and therefore the device of the present application is small in thermal resistance and good in heat dissipation, and also facilitates the promotion of the performance and reliability of the device.

4. Further, according to the present application, the ridge of the device is manufactured from the (000$\bar{1}$) nitrogen face, the (000$\bar{1}$) nitrogen face nitride semiconductor is easy to corrode, the ridge can be manufactured by wet etching, and therefore there is no influence resulting from defects, damage and surface state brought by dry etching so that the stability and reliability of the device are better.

The technical solution of the present application will be further explained and described in combination with several examples.

Example 1

A manufacturing process of a GaN-based blue light laser or super-radiance light-emitting diode of this example comprises:

S1: a nitride semiconductor laser or super-radiance light-emitting diode structure was grown on a GaN substrate by adopting a metal organic chemical vapor deposition (MOCVD) device, the nitride semiconductor laser or super-radiance light-emitting diode structure comprising: a n-GaN contact layer having a thickness of about 500 nm, 100 pairs of n-$Al_{0.16}$GaN/GaN super-crystal structures in which each layer is about 2.5 nm in thickness and serves as an n type optical limitation layer, a n-$In_{0.03}Ga_{0.97}$N waveguide layer having a thickness of about 100 nm, 3 pairs of $In_{0.16}Ga_{0.84}$N/GaN multiple quantum wells in which each layer of $In_{0.16}Ga_{0.84}$N/GaN quantum wells is about 2.5 nm in thickness and each layer of GaN barriers is about 15 nm in thickness; an unintentionally doped $In_{0.03}Ga_{0.97}$N waveguide layer having a thickness of about 80 nm, a p-$Al_{0.2}Ga_{0.8}$N electron barrier layer having a thickness of about 20 nm, 150 pairs of p-$Al_{0.16}$GaN/GaN super-crystal structures in which each layer is about 2.5 nm in thickness and serves as a p type optical limitation layer, and a p-GaN contact layer having a thickness of about 30 nm, see FIG. 1.

S2: the epitaxial wafer was washed by using acetone, alcohol, hydrochloric acid and deionized water, Ni having a thickness of about 5 nm and Au having a thickness of about 50 nm were respectively deposited on the p-GaN contact layer and annealed for 3 minutes at 500° C. at compressed air atmosphere by utilizing a quick anneal oven to form good ohmic contact, see FIG. 2.

S3: the epitaxial wafer was reversely bonded to a Si support sheet, the p face ohmic contact electrode Ni/Au of the laser or super-radiance light-emitting diode is downward, and this electrode is bonded to the metal Ti/Au on the Si support sheet by utilizing a bonding technique, wherein, the m face of the GaN should be maintained to be aligned to the 100 face of the support sheet.

S4: the GaN substrate was removed by adopting thinning, grinding, polishing and other methods, then partial n-GaN contact layer was etched by using induced coupling plasma (ICP) so that the thickness of the remained n-GaN contact layer was about 50 nm to manufacture an n type ohmic contact electrode, see FIG. 3.

S5: Ti having a thickness of about 50 nm/Pt having a thickness of about 50 nm/Au having a thickness of about 100 nm are sequentially deposited on the (000$\bar{1}$) nitrogen face n-GaN ohmic contact layer to form n type ohmic contact.

S6: photoresist was spin-coated on the (000T̄) nitrogen face n type ohmic contact electrode for photoetching to manufacture a ridge mask pattern, subsequently, wet etchicng was performed by adopting KOH solution of 80° C., and the corrosion depth was controlled to about 700 nm through control of time, so as to form the ridge of the laser or super-radiance light-emitting diode.

S7: SiN having a thickness of about 200 nm was deposited as an insulation medium film by using an induced coupling plasma chemical vapor deposition device to protect the side wall and etched mesa of the laser or super-radiance light-emitting diode, see FIG. 4.

S8: the SiN insulation medium film and the photoresist on the ridge were stripped by using acetone so as to expose out the n type ohmic contact electrode Ti/Pt/Au.

S9: photoresist was spin-coated for photoetching, and then a Ti having a thickness of about 50 nm/Au having a thickness of about 500 nm thickening electrode is deposited through magnetron sputtering, and stripping was performed by using acetone, see FIG. 5.

S10: photoresist was spin-coated for photoetching, then wet etching was performed using KOH solution of 80° C. until the corrosion of the nitride semiconductor on the mesa was ended, and the p type ohmic contact electrode was exposed out, see FIG. 6. Or, the support sheet can also be thinned, and metal was deposited on the other face of the support sheet to form electric contact, see FIG. 7.

S11: the Si support sheet was thinned, subsequently, the laser or super-radiance light-emitting diode was cleaved into strips along the a axis of the GaN material and then coated, and finally split, until the manufacture of the laser or the core of the super-radiance light-emitting diode was completed.

Example 2

A manufacturing process of a GaN-based near ultraviolet laser or super-radiance light-emitting diode of this example comprises:

S1: an ultraviolet laser or super-radiance light-emitting diode structure was grown on a Si (111) substrate by adopting a metal organic chemical vapor deposition (MOCVD) device, the ultraviolet laser or super-radiance light-emitting diode structure specifically comprising: an n-GaN contact layer having a thickness of about 500 nm, 120 pairs of n-$Al_{0.2}GaN/GaN$ super-crystal structures in which each layer is about 2.5 nm in thickness and serves as an n type optical limitation layer, a n-$Al_{0.02}Ga_{0.98}N$ n side waveguide layer having a thickness of about 80 nm, 2 pairs of $In_{0.03}Ga_{0.97}N/Al_{0.08}Ga_{0.92}N$ multiple quantum wells in which each layer of $In_{0.03}Ga_{0.97}N$ quantum wells is about 2.5 nm in thickness and each layer of $Al_{0.08}Ga_{0.92}N$ barriers is about 14 nm in thickness; an unintentionally doped $Al_{0.02}Ga_{0.98}N$ p side waveguide layer having a thickness of about 60 nm, a p-$Al_{0.25}Ga_{0.75}N$ electron barrier layer having a thickness of about 25 nm, 30 pairs of p-$Al_{0.16}GaN/GaN$ super-crystal structures in which each layer is about 2.5 nm in thickness and serves as a p type optical limitation layer, and a p-GaN contact layer having a thickness of about 20 nm, see FIG. 8.

S2: the epitaxial wafer of the laser or super-radiance light-emitting diode was washed, a ITO transparent film having a thickness of about 100 nm was deposited on the p-GaN contact layer and annealed for 3 minutes at 550° C. at compressed air atmosphere by utilizing a quick anneal oven to form good ohmic contact, see FIG. 9.

S3: 50 nm IGZO and 100 nm ITO were deposited on the ITO conducting film, and subsequently Ti having a thickness of about 30 nm/Au having a thickness of about 150 nm bonding metal were sequentially deposited on the ITO, see FIG. 10.

S4: the epitaxial wafer of the laser or super-radiance light-emitting diode was reversely bonded to a Si support sheet, the bonding metal Ti/Au of the laser or super-radiance light-emitting diode was downward to be bonded to the metal Ti/Au on the Si support sheet, wherein, the m face of the GaN should be maintained to be aligned to the 100 face of the support sheet.

S5: subsequently, the Si substrate was subjected to wet etching by adopting thinning, grinding, polishing and other methods in combination with room-temperature $H_3PO_4$ solution, and then partial n-GaN contact layer was etched by using an induced coupling plasma (ICP) so that the thickness of the remained n-GaN contact layer is about 70 nm to manufacture an n type ohmic contact electrode, see FIG. 11.

S6: Ti having a thickness of about 30 nm/Pt having a thickness of about 30 nm/Au having a thickness of about 50 nm were sequentially deposited on the (000T̄) nitrogen face n-GaN ohmic contact layer to form n type ohmic contact.

S7: photoresist was spin-coated on the (000T̄) nitrogen face n type ohmic contact electrode for photoetching to manufacture a ridge mask pattern, subsequently, wet etching was performed by adopting KOH solution of 70° C., and the corrosion depth was controlled to about 300 nm through control of time to form the ridge of the laser or super-radiance light-emitting diode.

S8: $SiO_2$ having a thickness of about 150 nm was deposited as an insulation medium film by using an induced coupling plasma chemical vapor deposition device to protect the side wall and etched mesa of the laser or super-radiance light-emitting diode, see FIG. 12.

S9: the $SiO_2$ insulation medium film and the photoresist on the ridge were stripped using acetone so as to expose out the n type ohmic contact electrode Ti/Pt/Au.

S10: photoresist was spin-coated for photoetching, then wet etching was performed using KOH solution of 80° C., until the corrosion of the nitride semiconductor at the mesa was ended, and the p type ohmic contact electrode was exposed.

S11: photoresist was spin-coated for photoetching, and then a Ti having a thickness of about 100 nm/Au having a thickness of about 300 nm thickening electrode was deposited through magnetron sputtering, and stripping was performed by using acetone to manufacture the thickening electrode, see FIG. 13.

S12: the cavity face of GaN was formed by using an induced coupling plasma etching technique and TMAH solution wet etching was performed to remove the damage.

S13: the Si support sheet was thinned, subsequently, the laser or super-radiance light-emitting diode was cleaved into strips along the a axis of the GaN material and then coated, and finally split, until the manufacture of the laser or the core of the super-radiance light-emitting diode was completed.

Example 3

A manufacturing process of a AlGaN-based deep ultraviolet laser or super-radiance light-emitting diode of this example comprises:

S1: a deep ultraviolet laser or super-radiance light-emitting diode structure was grown on a sapphire substrate by adopting a metal organic chemical vapor deposition (MOCVD) device, the deep ultraviolet laser or super-radiance light-emitting diode structure specifically comprising: an n-$Al_{0.45}Ga_{0.5}N$ contact layer having a thickness of about 1000 nm, 100 pairs of n-$Al_{0.65}Ga_{0.35}N/Al_{0.45}Ga_{0.55}N$ super-crystal structures in which each layer is about 2.3 nm in thickness and serves as an n type optical limitation layer, a n-$Al_{0.45}Ga_{0.55}N$ n side waveguide layer having a thickness of about 75 nm, 3 pairs of $Al_{0.35}Ga_{0.65}N/Al_{0.45}Ga_{0.55}N$ multiple quantum wells in which each layer of $Al_{0.35}Ga_{0.65}N$ quantum wells is about 3 nm in thickness and each layer of $Al_{0.45}Ga_{0.55}N$ barriers is about 10 nm in thickness, an unintentionally doped $Al_{0.45}Ga_{0.55}N$ p side waveguide layer having a thickness of about 60 nm, a p-$Al_{0.65}Ga_{0.35}N$ electron barrier layer having a thickness of about 20 nm, and a p-$Al_{0.45}Ga_{0.55}N$ contact layer having a thickness of about 50 nm, see FIG. 8.

S2: the epitaxial wafer of the laser or super-radiance light-emitting diode was washed, and an IGZO transparent film having a thickness of about 120 nm was deposited on the p-$Al_{0.45}Ga_{0.55}N$ contact layer and annealed for 4 minutes at 550° C. at compressed air atmosphere utilizing a quick anneal oven to form good ohmic contact, see FIG. 9.

S3: 100 nm ITO and 80 nm IGZO were deposited on the IGZO transparent conducting film, and subsequently Ti having a thickness of about 30 nm/Au having a thickness of about 120 nm bonding metal were sequentially deposited on the IGZO.

S4: the epitaxial wafer of the laser or super-radiance light-emitting diode was reversely bonded to a Al ceramic plate, and the bonding metal Ti/Au of the laser or super-radiance light-emitting diode was downward to be bonded to the metal Ti/Au on the Al ceramic plate.

S5: subsequently, the sapphire substrate was stripped by adopting a laser stripping technique, then partial n-$Al_{0.45}Ga_{0.55}N$ contact layer was etched by using an induced coupling plasma (ICP) so that the thickness of the remained n-$Al_{0.45}Ga_{0.55}N$ contact layer was about 30 nm to manufacture an n type ohmic contact electrode, see FIG. 11.

S6: Ti having a thickness of about 50 nm/Al having a thickness of about 100 nm/Ti having a thickness of about 50 nm/Au having a thickness of about 100 nm were deposited on the (000$\bar{1}$) nitrogen face n-GaN ohmic contact layer in turn to form n type ohmic contact.

S7: photoresist was spin-coated on the (000$\bar{1}$) nitrogen face n type ohmic contact electrode for photoetching to manufacture a ridge mask pattern, subsequently, wet etching was performed by adopting KOH solution of 80° C., and the corrosion depth wass controlled to about 400 nm through control of time to form the ridge of the laser or super-radiance light-emitting diode.

S8: $Al_2O_3$ having a thickness of about 200 nm was deposited as an insulation medium film by using an electron beam evaporation device to protect the side wall and etched mesa of the laser or super-radiance light-emitting diode, see FIG. 12.

S9: the $Al_2O_3$ insulation medium film and the photoresist on the ridge were stripped by using acetone so as to expose out the n type ohmic contact electrode.

S10: photoresist was spin-coated for photoetching, and then wet etching was performed using KOH solution of 60° C., until the corrosion of the nitride semiconductor at the mesa was ended, and the p type ohmic contact electrode was exposed.

S11: photoresist was spin-coated for photoetching, and then a Ti having a thickness of about 100 nm/Au having a thickness of about 400 nm thickening electrode was deposited through electron evaporation, and stripping was performed by using acetone to manufacture the thickening electrode, see FIG. 13.

S12: the AlN ceramic plate was thinned, and subsequently the laser or super-radiance light-emitting diode was cleaved into strips along the a axis of the GaN material and plated, and finally split, until the manufacture of the laser or the core of the super-radiance light-emitting diode was completed.

Example 4

A manufacturing process of a GaN-based green light laser or super-radiance light-emitting diode of this example comprises:

S1: a green light laser or super-radiance light-emitting diode structure was grown on a SiC substrate by adopting a metal organic chemical vapor deposition (MOCVD) device, the green light laser or super-radiance light-emitting diode structure specifically comprising: an n-GaN contact layer having a thickness of about 500 nm, a high-Si doped n-GaN layer having a thickness of 500 nm and serving as an n type optical limitation layer, n-$In_{0.05}Ga_{0.95}N$ n side waveguide layer having a thickness of about 110 nm, 2 pairs of $In_{0.3}Ga_{0.7}N/Ga_{0.55}N$ multiple quantum wells in which each layer of $In_{0.3}Ga_{0.7}N$ quantum wells is about 2.5 nm in thickness and each layer of GaN barriers is about 12 nm in thickness; an unintentionally doped $In_{0.05}Ga_{0.95}N$ p side waveguide layer having a thickness of about 90 nm, a p-$Al_{0.2}Ga_{0.8}N$ electron barrier layer having a thickness of about 15 nm, and a p-GaN contact layer having a thickness of about 20 nm, see FIG. 8.

S2: the epitaxial wafer of the laser or super-radiance light-emitting diode was washed, a ITO transparent film having a thickness of about 100 nm was deposited on the p-GaN contact layer and annealed for 6 minutes at 450° C. at compressed air atmosphere by utilizing a quick anneal oven to form relatively good ohmic contact, see FIG. 9.

S3: 3 pairs of 80 nm $SiO_2$/58 nm $TiO_2$ were deposited on the ITO conducting film in turn, and subsequently Ti having a thickness of about 40 nm/Au having a thickness of about 130 nm bonding metals were sequentially deposited on the $ITO_2$, see FIG. 10.

S4: the epitaxial wafer of the laser or super-radiance light-emitting diode was reversely bonded to a molybdenum support sheet, the bonding metal Ti/Au of the laser or super-radiance light-emitting diode was downward to be bonded to the metal Ti/Au on the molybdenum support sheet.

S5: subsequently, the SiC substrate was removed by adopting thinning, grinding and other methods in combination with KOH solution wet etching, then partial n-GaN contact layer was etched by using ion beam etching (IBE) so that the thickness of the remained n-GaN contact layer was about 20 nm to manufacture the n type ohmic contact electrode, see FIG. 11.

S6: electrochemical corrosion was performed to corrode the high-Si-doped n-GaN layer into a porous GaN structure.

S7: Ti having a thickness of about 80 nm/Pt having a thickness of about 50 nm/Au having a thickness of about 100 nm were deposited on the (000$\bar{1}$) nitrogen face n-GaN ohmic contact layer in turn to form n type ohmic contact.

S8: photoresist was spin-coated on the (000$\bar{1}$) nitrogen face n type ohmic contact electrode for photoetching to manufacture a ridge mask pattern, subsequently, wet etching was performed by adopting TMAH solution of 40° C., and the corrosion depth was controlled to about 400 nm through control of time to form the ridge of the laser or super-radiance light-emitting diode.

S9: AlN having a thickness of about 150 nm was deposited as an insulation medium film by using an atom deposition device to protect the side wall and etched mesa of the laser or super-radiance light-emitting diode, see FIG. 12.

S10: the AlN insulation medium film and the photoresist on the ridge were stripped using acetone so as to expose out the n type ohmic contact electrode Ti/Pt/Au.

S11: photoresist was spin-coated for photoetching, and then wet etching was performed using KOH solution of 60° C., until the corrosion of the nitride semiconductor at the mesa was ended, and the p type ohmic contact electrode ITO was exposed.

S12: photoresist was spin-coated for photoetching, and then a Ni having a thickness of about 30 nm/Au having a thickness of about 400 nm thickening electrode was deposited through magnetron sputtering, and stripping was performed by using acetone to manufacture the thickening electrode, see FIG. 13.

S13: the cavity face of the laser or super-radiance light-emitting diode was formed using an induced coupling plasma etching technique and ion damage was removed by using TMAH solution wet etching.

S13: the molybdenum support sheet was thinned, and subsequently the laser or super-radiance light-emitting diode was cleaved into strips along the a axis of the GaN material and plated, and finally split, until the manufacture of the laser or the core of the super-radiance light-emitting diode was completed.

It is noted that the term "include", "comprise" or any other variants thereof are intended to contain non-exclusive inclusion, so that a process, method, article or device that includes a series of elements includes not only those elements, but also other elements that are not explicitly listed, or includes elements inherent for such the process, method, article or device. Without more restrictions, the element defined by the statement "includes one . . . " does not exclude that additional identical elements are also present in the process, method, article or equipment that include the elements.

It should be understood that the above descriptions are only embodiments of the present application. For those of ordinary skill in the art, several improvements and modifications can also be made without departing from the principle of the present application. These improvements and modifications should also be considered as the scope of protection of the present application.

What is claimed is:

1. A nitride semiconductor light-emitting device, comprising an epitaxial structure, wherein, the epitaxial structure has a first face and a second face opposite to the first face, the first face is a (0001) nitrogen face and is located at an n type side of the epitaxial structure, the second face is located at a p type side of the epitaxial structure, the n type side of the epitaxial structure is electrically contacted with an n type electrode, the p type side is electrically contacted with a p type electrode, and a ridge waveguide structure is formed on the first face.

2. The nitride semiconductor light-emitting device according to claim 1, wherein, the epitaxial structure comprises an n type contact layer, an n side waveguide layer, an active area, a p side waveguide layer and a p type contact layer which are arranged in turn, ohmic contact is formed between the n type electrode and the n type contact layer, ohmic contact is formed between the p type electrode and the p type contact layer, and the p type electrode is contacted with the entire face of the p type contact layer.

3. The nitride semiconductor light-emitting device according to claim 2, wherein, an n type optical limitation layer is provided between the n type contact layer and the n side waveguide layer, and a p type optical limitation layer and a p type optical limitation layer are provided in turn between the p type side waveguide layer and the p type contact layer.

4. The nitride semiconductor light-emitting device according to claim 2, wherein, the materials of the n type contact layer, the p type contact layer, the n type optical limitation layer, the p type optical limitation layer, the p side waveguide layer and the n side waveguide layer comprise $Al_{x1}In_{y1}Ga_{(1-x1-y1)}N$, wherein, both of x1 and y1 are larger than or equal to 0 and less than or equal to 1, and 0<(x1+y1)<1, and/or the material of the active area comprises $Al_{x2}In_{y2}Ga_{(1-x2-y2)}N$ or $Al_{x3}In_{y3}Ga_{(1-x3-y3)}N$, wherein, x2, y2, x3 and y3 are all larger than or equal to 0 and less than or equal to 1, 0<(x2+y2)<1, and 0<(x3+y3)<1.

5. The nitride semiconductor light-emitting device according to claim 1, wherein, an insulation film is also covered on the at least partial region of the first face of the epitaxial structure except the ridge waveguide structure, and/or, an thickening electrode is also covered on the first face of the epitaxial structure, and the thickening electrode is electrically connected with the n type electrode.

6. The nitride semiconductor light-emitting device according to claim 1, wherein, the ridge waveguide structure is 0.5100 μm in ridge wideness and 02 μm in ridge depth.

7. The nitride semiconductor light-emitting device according to claim 1, wherein, the p type electrode is connected with the a support sheet through a bonding layer, an optical field limitation layer is provided between the p type electrode and the bonding layer, the optical field limitation layer comprises at least one low-refractive-index material, and the material of the optical field limitation layer comprises any one or a combination of two or more of $SiO_2$, SiN, $TiO_2$, $ZrO_2$, AlN, $Al_2O_3$, $Ta_2O_5$, $HfO_2$, $HfSiO_4$, AlON, porous GaN, TiN, ITO and IGZO.

8. The nitride semiconductor light-emitting device according to claim 1, wherein, the nitride semiconductor light-emitting device comprises a III-V nitride semiconductor laser or a super-radiance light-emitting diode.

9. A manufacture method of a nitride semiconductor light-emitting device, comprising:
   growing and forming an epitaxial structure of a nitride semiconductor light-emitting device on a substrate, wherein, the epitaxial structure has a first face combined with the substrate and a second face opposite to the first face, the first face is a (0001) nitrogen face and is located at an n type side of the epitaxial structure, and the second face is located at a p type side of the epitaxial structure;
   providing a p type electrode on the second face of the epitaxial structure, and allowing the p type electrode and the p type side of the epitaxial structure to form ohmic contact;
   removing the substrate, then providing an n type electrode on the first face of the epitaxial structure, and allowing the n type electrode and the n type side of the epitaxial structure to form ohmic contact; and
   etching or corroding the first face of the epitaxial structure to form a ridge waveguide structure providing an etching mask on the first face of the epitaxial structure, then etching or corroding the first face of the epitaxial structure using a wet etching process to form the ridge waveguide structure.

10. The manufacture method according to claim 9, wherein, the ridge waveguide structure is 0.5~100 μm in ridge wideness and 0~2 μm in ridge depth.

11. The manufacture method according to claim 9, the manufacture method also comprising: forming an optical field limitation layer on the p type electrode, and then bonding the optical field limitation layer to the support sheet by utilizing a bonding material, the optical field limitation layer comprises at least one low-refractive-index material, and the material of the optical field limitation layer comprises any one or a combination of two or more of $SiO_2$, $TiO_2$, $ZrO_2$, AlN $Al_2O_3$, $Ta_2O_5$, $HfO_2$, $HfSiO_4$, AlON, porous GaN, TiN, ITO and IGZO.

12. The manufacture method according to claim 9, the manufacture method comprising: sequentially growing an n type contact layer, an n type optical limitation layer, an n side waveguide layer, an active area, a p side waveguide layer, an electron barrier layer, a p type optical limitation layer and a p type contact layer on a substrate to form the epitaxial structure, then depositing a conducting material as the p type electrode on the p type contact layer and performing ohmic contact annealing, so that the p type electrode and the p type contact layer form ohmic contact, and the p type electrode is contacted with the entire face of the p type contact layer, the materials of the n type contact layer, the p type contact layer, the n type optical limitation layer, the p type optical limitation layer, the p side waveguide layer and the n side waveguide layer comprise $Al_{x1}In_{y2}Ga_{(1-x2-y2)}N$, wherein, both of x1 and y1 are larger than or equal to 0 and less than or equal to 1, and $0 \leq (x1+y1) \leq 1$, and/or the material of the active area comprises $Al_{x2}In_{y2}Ga_{(1-x2-y2)}N$ or $Al_{x3}In_{y3}Ga_{(1-x3-y3)}N$, wherein, x2, y2, x3 and y3 are all larger than or equal to 0 and less than or equal to 1, $0 \leq (x2+y2) \leq 1$, and $0 \leq (x3+y3) \leq 1$.

13. The manufacture method according to claim 9, the manufacture method also comprising: after the substrate is removed, performing thinning treatment on the n type contact layer, then depositing a conducting material as an n type electrode on the n type contact layer and performing ohmic contact annealing, so that the n type electrode and the n type contact layer form ohmic contact.

14. The manufacture method according to claim 9, the manufacture method also comprising: after the ridge waveguide structure is formed, covering an insulation film on at least partial region of the first face of the epitaxial structure except the ridge waveguide structure, and exposing the n type electrode out of the insulation film, subsequently etching or corroding the epitaxial structure by using a dry etching or wet etching process, forming a mesa structure at one side of the ridge waveguide structure, and distributing the p type electrodes at the bottom of the mesa structure, and then manufacturing the thickening electrodes on the p type electrode and the n type electrode, then preparing a cavity surface of a nitride semiconductor light-emitting device by using any one or a combination of two or more of cleavage, dry etching and wet etching, and coating and splitting to form the tube core of the nitride semiconductor light-emitting device.

\* \* \* \* \*